(12) United States Patent
Kramer (10) Patent No.: US 10,025,181 B2
(45) Date of Patent: Jul. 17, 2018

(54) POLYMER COMPOSITION AND PHOTORESIST COMPRISING SAME

(75) Inventor: John W. Kramer, Mt. Pleasant, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 517 days.

(21) Appl. No.: 13/529,541

(22) Filed: Jun. 21, 2012

(65) Prior Publication Data
US 2012/0328983 A1 Dec. 27, 2012

Related U.S. Application Data (60) Provisional application No. 61/501,502, filed on Jun. 27, 2011.

(51) Int. Cl.
| | | |
|---|---|---|
| C08F 220/38 | (2006.01) | |
| G03F 7/004 | (2006.01) | |
| G03F 7/30 | (2006.01) | |
| C08F 220/28 | (2006.01) | |
| G03F 7/039 | (2006.01) | |
| C08F 2/38 | (2006.01) | |
| C08F 220/18 | (2006.01) | |
| C08F 220/24 | (2006.01) | |

(52) U.S. Cl.
CPC .......... *G03F 7/0046* (2013.01); *C08F 2/38* (2013.01); *C08F 220/18* (2013.01); *C08F 220/24* (2013.01); *C08F 220/28* (2013.01); *C08F 220/38* (2013.01); *G03F 7/0045* (2013.01); *G03F 7/0397* (2013.01)

(58) Field of Classification Search
CPC combination set(s) only.
See application file for complete search history.

(56) References Cited

U.S. PATENT DOCUMENTS

| 7,834,113 B2 | 11/2010 | Sounik et al. | |
|---|---|---|---|
| 2005/0032997 A1* | 2/2005 | Lee et al. | 526/223 |
| 2010/0104974 A1 | 4/2010 | Kaneko et al. | |
| 2010/0304302 A1 | 12/2010 | Masunaga et al. | |
| 2011/0177453 A1* | 7/2011 | Masubuchi et al. | 430/270.1 |

FOREIGN PATENT DOCUMENTS

| EP | 1630607 A2 | 3/2006 |
|---|---|---|
| JP | 2007246588 A | 9/2007 |
| JP | 2008239889 A | 10/2008 |
| WO | 9801478 | 1/1998 |
| WO | 2005000924 A1 | 1/2005 |
| WO | 2009054620 A2 | 4/2009 |
| WO | WO-2010/044372 A1 * | 4/2010 |

OTHER PUBLICATIONS

Sheehan et al .: "RAFT Technology for the Production of Advanced Photoresist Polymers"; Advances in Resist Materials and Processing Technology XXV, edited by Clifford L. Hederson; Proc. of SPIE; 6923; 69232E-1 to 69232E-9, nine pages.*
Lowe et al., Chapter 7 from Christopher Barner-Kowollik, ed, Handbook of RAFT Polymerization edited by Christopher Barner-Kowollik, WILEY-VCH, 2008, front Matter (10 pages) and chapter 7, pp. 235-284.*
European Search Report dated Oct. 11, 2012; Application No. 12173331.5; 3 pages.
Gallatin et al.; "Fundamental Limits to EUV Photoresist"; Advances in Resist Materials and Processing Technology XXIV; edited by Qinghuang Lin; Proc. of SPIE; vol. 6519, 651911; (2007).
Kim, et al.; "Synthesis of Photoacid Generator-Containing Patternable Diblock Copolymers by Reversible Addition—Fragmentation Transfer Polymerization"; Chem. Mater; 21; pp. 3030-3032; (2009).
Sheehan, et al.; "RAFT Technology for the Production of Advanced Photoresist Polymers"; Advances in Resist Materials and Processing Technology XXV, edited by Clifford L. Henderson; Proc. of SPIE; 6923; 69232E; 6 pages; (2003), missing last three pages of 9 page article.

* cited by examiner

*Primary Examiner* — Cynthia Hamilton
(74) *Attorney, Agent, or Firm* — Cantor Colburn LLP (57) ABSTRACT

A polymer comprises the polymerized product of monomers comprising an acid-deprotectable monomer, a base-soluble monomer, a lactone-containing monomer, and a photoacid-generating monomer; a chain transfer agent of the formula;

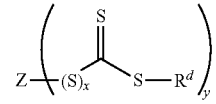

wherein Z is a y valent $C_{1-20}$ organic group, x is 0 or 1, $R^d$ is a substituted or unsubstituted $C_{1-20}$ alkyl, $C_{3-20}$ cycloalkyl, $C_{6-20}$ aryl, or $C_{7-20}$ aralkyl; and optionally, an initiator.

12 Claims, 1 Drawing Sheet

POLYMER COMPOSITION AND PHOTORESIST COMPRISING SAME

This application is a nonprovisional filing of and claims priority to provisional U.S. application No. 61/501,502, filed on Jun. 27, 2011, the contents of which are incorporated herein by reference in their entirety.

BACKGROUND

Design rules for advanced generation microlithography (i.e., beyond 193 nm immersion lithography and into next generation optics such as e-beam, X-ray, and extreme ultraviolet (EUV) lithography operating at a very short wavelength of 13.4 nm) are trending toward smaller and smaller dimensions, for example, 30 nm and below. In general, depth of focus (DOF) necessarily decreases with higher resolution due to the higher numerical aperture (NA) and therefore resist thickness also decreases commensurate to the smaller and smaller feature sizes. With narrower linewidths and thinner resist films, consistency issues such as line width roughness (LWR) and resolution take on increasing significance limiting the performance and usefulness of photoresists. These phenomena are of interest in the fabrication of semiconductor devices; for example, excessive LWR can lead to poor etch and lack of linewidth control in, for example, transistor and gate architecture, potentially causing short circuits and signal delay.

Achieving such feature may be improved with polymers having well-controlled properties of composition, molecular weight, and polydispersity. Acrylate-based EUV photoresist polymers may be synthesized by a modified free radical polymerization techniques in which careful control of monomer and initiator feed rates helps to control the composition, but termination and chain transfer reactions may cause composition drift throughout the polymerization and a relatively broad distribution of molecular weights. Because such diversity is a significant factor affecting resist solubility, a broad composition and molecular weight distribution are undesired.

Controlled radical polymerization techniques have become more practical in the last decade, and acrylate polymers with polydispersities as low as 1.05 may be prepared. This invention relates to the modification of polymerization conditions for EUV photoresists to employ a dithioester chain transfer agent (CTA), which successfully controls molecular weight distributions. As shown in the Example section, polydispersities as low as 1.2-1.3 can be achieved compared to PDIs of approximately 2.0 for traditional free radical polymerizations. Additional benefits have been realized using controlled radical polymerization, such as the ability to accurately target a specific molecular weight based on the amount of CTA and the option to end-functionalize polymers due to the living-like behavior of the polymerization. Furthermore, controlled radical polymerizations can be run to high conversion (>80%) without the deleterious effects typically observed for free radical polymerizations at high conversion. This allows for improved polymer yields and easier purification of polymer from unreacted monomer.

As described in *Proc. of SPIE Vol. 6923, 2008, 69232E-1-69232E-9*, reversible addition fragmentation transfer (RAFT) polymerization techniques have been used to produce photoresist polymers for 193 nm lithography. However, photoresist polymers having improved (i.e., decreased) linewidth roughness are still desirable for EUV applications.

STATEMENT OF INVENTION

One or more of the above and other deficiencies of the prior art may be overcome by a polymer in accordance with the invention, comprising the polymerized product of monomers comprising an acid-deprotectable monomer having the formula (I), a base-soluble monomer having the formula (II), a lactone-containing monomer of the formula (III), and a photoacid-generating monomer of the formula (IV):

wherein each $R^a$ is independently H, F, $C_{1-10}$ alkyl, or $C_{1-10}$ fluoroalkyl, $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure, $Q_1$ is an ester-containing or non-ester containing $C_{1-20}$ alkyl, $C_{3-20}$ cycloalkyl, $C_{6-20}$ aryl, or $C_{7-20}$ aralkyl, W is a base-reactive group comprising —C(=O)—OH; —C(CF$_3$)$_2$OH; —NH—SO$_2$—Y$^1$ where Y$^1$ is F or $C_{1-4}$ perfluoroalkyl; an aromatic —OH; or an adduct of any of the foregoing with a vinyl ether, a is an integer of 1 to 3, L is a monocyclic, polycyclic, or fused polycyclic $C_{4-20}$ lactone-containing group, $Q_2$ is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non ester-containing and fluorinated or non-fluorinated, and is $C_{1-20}$ alkyl, $C_{3-20}$ cycloalkyl, $C_{6-20}$ aryl, or $C_{7-20}$ aralkyl, Z is an anionic moiety comprising sulfonate, an anion of a sulfonamide, or an anion of a sulfonimide, G has formula (V):

wherein X is S or I, each $R^c$ is halogenated or non-halogenated and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ groups is optionally attached to one adjacent $R^c$ group by a single bond, and z is 2 or 3, wherein when X is I, z is 2, or when X is S, z is 3; a chain transfer agent of formula (IX);

wherein in formula (IX), Z is a y valent $C_{1-20}$ organic group, x is 0 or 1, $R^d$ is a substituted or unsubstituted $C_{1-20}$ alkyl, $C_{3-20}$ cycloalkyl, $C_{6-20}$ aryl, or $C_{7-20}$ aralkyl; and optionally, an initiator.

Also provided is a photoresist composition comprising the aforementioned polymer.

Also provided is a coated substrate comprising (a) a substrate having one or more layers to be patterned on a surface thereof; and (b) a layer of a photoresist composition prepared using the aforementioned polymer over the one or more layers to be patterned.

Also provided are methods of forming the aforementioned polymer comprising radically or thermally initiating the above monomers in the presence of the chain transfer agent.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Disclosed herein are narrow polydispersity (e.g., Mw/Mn<2.0) (meth)acrylate-based polymers, which include ionic photoacid generators (PAGs) bound to the polymer chain and introduced as a polymerizable (meth)acrylate monomer. The PAG is preferably connected through the anion by a tethering group. The polymer further includes monomers having high-activation energy ($E_a$) acid-sensitive protecting groups, sometimes referred to herein as "leaving groups," which mask a base-reactive functional group such as, for example, a carboxylic acid group; a monomer having a base-soluble group such as a hexafluoroisopropanol group, a phenolic OH, etc., and a lactone-containing monomer.

As used herein, "polymer" includes a polymer having two or more different monomeric units, and includes copolymers having two monomeric units, terpolymers having three monomeric units, tetrapolymers having four monomeric units, pentapolymers having five monomeric units, etc. It will also be appreciated that the copolymers disclosed herein may be random copolymers, block copolymers, alternating copolymers, or a combination including two or more of these motifs. The polymer may also have a compositional gradient. Preferably, the copolymers are random copolymers, where no particular order of the monomers is implied by the formulas. As used herein, an "aryl" is an aromatic group and may be monocyclic, for example, a phenyl group; polycyclic, for example, a biphenyl group; or fused polycyclic, for example, a naphthyl group, and it will be understood that "aryl" includes all aromatic structures including those of fewer than 6 carbon atoms such as heteroaromatic compounds including pyrazoles, thiophenes, oxazoles, pyridines, etc. Also as used herein, an "alkyl" group is an sp$^3$ hybridized carbon containing group and may be linear or branched, and may include cycloalkyl unless otherwise specified. As used herein, "aralkyl" means a group, which contains both an aryl moiety and an alkyl moiety, where either the aryl or the alkyl group is the point of attachment to the adjacent radical. Further, "anion-bound" means that an organic tethering group, e.g., an alkyl, aryl, alkoxy, polyalkoxy, acetal or ketal-containing group, or other appropriate group, forms a covalently bonded structure between the anion of the PAG and the polymer. Also as used herein, "substituted" means including a substituent such as a halogen (i.e., F, Cl, Br, I), hydroxy, amino, thiol, carboxyl, carboxylate, amide, nitrile, thiol, sulfide, disulfide, nitro, a $C_{1-10}$ alkyl, a $C_{1-10}$ alkoxy, a $C_{6-10}$ aryl, a $C_{6-10}$ aryloxy, a $C_{7-10}$ alkyl aryl, a $C_{7-10}$ alkyl aryloxy, or a combination comprising at least one of the foregoing. It will be understood that any group or structure disclosed with respect to the formulas herein may be so substituted unless otherwise specified, or where such substitution would significantly adversely affect the desired properties of the resulting structure.

The polymer disclosed herein includes the polymerized product of monomers, a chain transfer agent, and an initiator. The polymer comprises monomers comprising an acid-deprotectable monomer having the formula (I), a base-soluble monomer having the formula (II), a lactone-containing monomer of the formula (III), and a photoacid-generating monomer of the formula (IV):

(III)

(IV)

wherein each $R^a$ is independently H, F, $C_{1-10}$ alkyl, or $C_{1-10}$ fluoroalkyl. Preferably, $R^a$ may be H, F, $C_{1-6}$ alkyl, or $CF_3$. As used throughout this specification, "fluoro" or "fluorinated" means that one or more fluorine groups are attached to the associated group. For example, by this definition and unless otherwise specified, "fluoroalkyl" encompasses monofluoroalkyl, difluoroalkyl, etc., as well as perfluoroalkyl in which substantially all carbon atoms of the alkyl group are substituted with fluorine atoms; similarly, "fluoroaryl" means monofluoroaryl, perfluoroaryl, etc. "Substantially all" in this context means greater than or equal to 90%, preferably greater than or equal to 95%, and still more specifically greater than or equal to 98% of all atoms attached to carbon are fluorine atoms.

In formula (I), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. Preferably, the tertiary group including $R^b$ in formula (I) is a t-butyl group. More preferably, formula (I) may include cycloalkyl structures, which incorporate two or more $R^b$ groups, such as 1-methylcyclopentyl, 1-ethylcyclopentyl, and 1-methylcyclohexyl, and the like.

Exemplary acid deprotectable monomers of formula (I) may include:

or a combination comprising at least one of the foregoing, wherein $R^a$ is H, F, $C_{1-6}$ alkyl, or $C_{1-6}$ fluoroalkyl.

In formula (II), $Q_1$ is an ester-containing or non-ester containing $C_{1-20}$ alkyl, $C_{3-20}$ cycloalkyl, $C_{6-20}$ aryl, or $C_{7-20}$ aralkyl group. Preferably where an ester is included, the ester forms a connective link between $Q_1$ and the point of attachment to the double bond. In this way, where $Q_1$ is an ester group, formula (II) may be a (meth)acrylate monomer. Where an ester is not included, $Q_1$ is preferably aromatic, so that formula (II) may be, for example, a styrenic monomer or vinyl naphthoic monomer. $Q_1$ may be fluorinated or non-fluorinated. Further in formula (II), a is an integer of 1 to 3, and preferably, a is 1 or 2.

Also in formula (II), W is a base-reactive group comprising —C(=O)—OH; —C(CF$_3$)$_2$OH; —NH—SO$_2$—Y$^1$ where Y$^1$ is F or $C_{1-4}$ perfluoroalkyl; an aromatic —OH; or an adduct of any of the foregoing with a vinyl ether. Preferably, where Q is non-aromatic (e.g., where formula (II) comprises a (meth)acrylate structure having an ester linked alkyl or cycloalkyl group Q), W is —C(CF$_3$)$_2$OH. Also preferably, where Q is aromatic (e.g., where Q is either ester-linked or non-ester linked and is an aromatic group such as phenyl or naphthyl), W is OH or —C(CF$_3$)$_2$OH. It is contemplated that any of the base-reactive groups may further be protected by an acid decomposable acetal leaving group (e.g., having a generic structure —O—CH(R')—O—R" where R' may be a methyl, ethyl, or other alkyl group) Such groups are adducts of a vinyl ether, such as, for example, ethyl vinyl ether, propyl vinyl ether, t-butyl vinyl ether, cyclohexylvinyl ether, the 2-vinyloxyethyl ester of 1-adamantane carboxylic acid, 2-naphthoylethylvinylether, or other such vinyl ethers.

Exemplary base-soluble monomers having the formula (II) may include:

-continued or a combination comprising at least one of the foregoing, wherein $R^a$ is H, F, $C_{1-6}$ alkyl, or $C_{1-6}$ fluoroalkyl.

In formula (III), L is a monocyclic, polycyclic, or fused polycyclic $C_{4-20}$ lactone-containing group. Such lactone groups may be included to improve both adhesion of the polymer to a substrate, and to moderate the dissolution of the polymer in base developer. Preferably, L is a monocyclic $C_{4-6}$ lactone which is attached to a (meth)acrylate moiety through a monocycle ring carbon; or L is a $C_{6-10}$ fused polycyclic lactone based on a norbornane-type structure.

Lactone-containing monomers may preferably have the formula (IIIa):

(IIIa)

wherein $R^a$ is $R^a$ is H, F, $C_{1-6}$ alkyl, or $C_{1-6}$ fluoroalkyl, R is a $C_{1-10}$ alkyl, cycloalkyl, or heterocycloalkyl, and w is an integer of 0 to 6. It will be appreciated in formula (IIIa) that R may be separate or may be attached to the lactone ring and/or one or more R groups, and that the methacrylate moiety may be attached to the lactone ring directly, or indirectly through R.

Exemplary lactone-containing monomers of the formula (III) and (IIIa) may include:

or a combination comprising at least one of the foregoing, wherein $R^a$ is H, F, $C_{1-6}$ alkyl, or $C_{1-6}$ fluoroalkyl.

In formula (IV), A is ester-containing or non ester-containing and fluorinated or non-fluorinated, and is $C_{1-20}$ alkyl, $C_{3-20}$ cycloalkyl, $C_{6-20}$ aryl, or $C_{7-20}$ aralkyl. Useful A groups may include fluorinated aromatic moieties, straight chain fluoroalkyl, or branched fluoroalkyl esters. Preferably, A is a $—[(C(R^e)_2)_xC(=O)O]_c—(C(R^f)_2)_y(CF_2)_z—$ group, or an o-, m- or p-substituted $—C_6R^g{}_4—$ group, where each $R^e$, $R^f$, and $R^g$ are each independently H, F, $C_{1-6}$ fluoroalkyl, or $C_{1-6}$ alkyl, c is 0 or 1, x is an integer of 1 to 10, y and z are independently integers of from 0 to 10, and the sum of y+z is at least 1.

In formula (IV), $Q_2$ is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group. Preferably where an ester is included, the ester forms a connective link between $Q_2$ and the point of attachment to the double bond. In this way, where $Q_2$ is an ester group, formula (IV) may be a (meth)acrylate monomer. Where an ester is not included, $Q_2$ is preferably aromatic, so that formula (IV) may be, for example, a styrenic monomer or vinyl naphthoic monomer.

In formula (IV), Z is an anionic group including a sulfonate ($—SO_3^-$), the anion of a sulfonamide ($—SO_2(N^-)$ R' where R' is a $C_{1-10}$ alkyl or $C_{6-20}$ aryl, or the anion of a sulfonimide. Where Z is a sulfonimide, the sulfonimide may be an asymmetric sulfonimide having the general structure $A-SO_2—(N^-)—SO_2—Y^2$, where A is as described above, and $Y^2$ is a straight chain or branched $C_{1-10}$ fluoroalkyl group. Preferably, the $Y^2$ group is a $C_{1-4}$ perfluoroalkyl group, and is derived from the corresponding perfluorinated alkanesulfonic acid, such as trifluoromethanesulfonic acid or perfluorobutanesulfonic acid.

Preferably, the monomer of formula (IV) may have the structure of formula (IVa) or (IVb):

(IVa)

(IVb)

wherein A and $R^a$ are as defined for formula (IV).

Formula (IV) further comprises a cation G, which may be a metal or non-metal cation. Preferred non-metal cations include onium cations, such as those based on sulfonium, oxonium, or iodonium. Preferably, the cation G is an onium cation having the formula (V):

(V)

wherein X is S or I, each $R^c$ is halogenated or non-halogenated and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ groups is optionally attached to one adjacent $R^c$ group by a single bond, and z is 2 or 3, wherein when X is I, z is 2, or when X is S, z is 3.

Preferred cations G have the formula (VI), (VII), or (VIII):

(VI)

(VII)

(VIII)

wherein X is I or S, $R^h$, $R^i$, $R^j$, and $R^k$ are each independently hydroxy, nitrile, halogen, $C_{1-10}$ alkyl, $C_{1-10}$ fluoroalkyl, $C_{1-10}$ alkoxy, $C_{1-10}$ fluoroalkoxy, $C_{6-20}$ aryl, $C_{6-20}$ fluoroaryl, $C_{6-20}$ aryloxy, or $C_{6-20}$ fluoroaryloxy, $Ar^1$ and $Ar^2$ are independently $C_{10-30}$ fused or singly bonded polycyclic aryl groups; $R^1$ is a lone pair of electrons where X is I, or a $C_{6-20}$ aryl group where X is S; p is an integer of 2 or 3, wherein when X is I, p is 2, and where X is S, p is 3, q and r are each independently an integer from 0 to 5, and s and t are each independently an integer from 0 to 4.

Exemplary photoacid-generating monomers of formula (IV) include:

or a combination comprising at least one of the foregoing, where each $R^a$ is independently H, F, $C_{1-6}$ alkyl, or $C_{1-6}$ fluoroalkyl, k is an integer of 0 to 4, 1 is an integer of 0 to 3, and G is a cation of formula (V). Preferably, G is a cation of formulas (VI), (VII), or (VIII).

Specific exemplary photoacid-generating monomers of formula (IV) include those having the formula:

or wherein $R^a$ is H, F, $C_{1-6}$ alkyl, or $C_{1-6}$ fluoroalkyl.

The polymer further includes the polymerization product of a chain transfer agent. The chain transfer agent includes any compound based on the dithioester or trithiocarbonate functional groups and suitable for chain transfer under conditions of reversible addition-fragmentation transfer (RAFT) polymerization. The chain transfer agent comprises a compound of formula (IX):

(IX)

wherein in formula (IX), x is 0 or 1, and Z is a y valent $C_{1-20}$ organic group. Z is substituted or unsubstituted and is preferably a $C_{1-20}$ alkyl, $C_{3-20}$ cycloalkyl, $C_{6-20}$ aryl, or $C_{7-20}$ aralkyl, and may contain a halogen, ether, sulfide, carboxylic acid, ester, amide, nitrile, or other functional group. While y may be any integer of 1 or greater depending on the valence of group Z, y is preferably an integer of from 1 to 3, and more preferably 1 or 2.

Also in formula (IX), $R^d$ is a substituted or unsubstituted $C_{1-20}$ alkyl, $C_{3-20}$ cycloalkyl, $C_{6-20}$ aryl, or $C_{7-20}$ aralkyl. Preferably, $R^d$ is derived from a radical initiator such as a peroxy or diazo initiator.

Preferably, the chain transfer agent may include that in which Z is a $C_6$ aryl group, such as those of formula (X):

(X)

wherein $R^m$ is a $C_{1-10}$ alkyl, $C_{1-10}$ alkoxy, $C_{3-10}$ cycloalkyl, $C_{6-10}$ aryl, or $C_{7-10}$ aralkyl group, z is an integer from 0 to 5, and $R^c$ is substituted or unsubstituted and is a $C_{1-10}$ alkyl or $C_{6-10}$ aryl group.

Exemplary chain transfer agents of formula (VI) include:

or a combination comprising at least one of the foregoing.

The polymer is optionally the polymerized product of the above monomers and chain transfer agent with an initiator. Suitable initiators may include any radical initiator useful in the art, such as peroxy initiators, diazo initiators, and the like. For example, peroxy initiators such as tert-butyl hydroperoxide, tert-butyl peroxy 2-ethyl hexanoate (tert-butyl peroctoate), t-butyl peroxy pivalate, tert-butyl peroxy benzoate, di-benzoyl peroxide, tert-butyl peroxy isobutyrate, diazo initiators such as azobis isobutyronitrile (AIBN), 4,4-azobis(4-cyanovaleric acid), 4,4-azobis(cyanovaleric acid); and the like. Preferred initiators include those sold under the tradename VAZO by DuPont, such as VAZO 52, VAZO 67, VAZO 88, and VAZO V-601 free-radical initiators. Alternatively, the polymerization may be carried out by thermal initiation (e.g., greater than about 120° C., more preferably greater than about 150° C.). Preferably, thermal initiation may be used where one or more component monomers are styrenic.

The polymer may thus be prepared by radically or thermally initiated polymerization of the monomers, preferably in a degassed solvent, in the presence of the chain transfer agent, using the aforementioned reversible addition-fragmentation transfer (RAFT) process. The polymerization may be carried out in batch mode, by batch addition of monomers and/or initiator to the reaction mixture containing the chain transfer addition, by metered addition of separate feeds of one or more of the monomers and/or initiator and/or chain transfer agent to the reaction mixture, or any other suitable method for combining the reactants. It will be appreciated that block copolymers may be produced by sequential addition of monomers for each block to the reaction mixture, or a polymer having a graded composition may be formed by gradually changing the monomer proportions and/or composition in the feed over time. All such polymers preparable by the RAFT method are contemplated herein.

The polymer may have a weight-averaged molecular weight (Mw) of 1,000 to 100,000 g/mol, preferably 1,500 to 50,000 g/mol, more preferably 2,000 to 25,000 g/mol, and still more preferably 3,000 to 15,000 g/mol. The polymer may also have a number averaged molecular weight (Mn) of 500 to 100,000 g/mol, preferably 1,000 to 50,000 g/mol, more preferably 1,500 to 25,000 g/mol, and still more preferably 2,000 to 15,000 g/mol. Molecular weights may be determined using any suitable method, such as gel permeation chromatography (GPC) using a crosslinked styrene-divinylbenzene column calibrated to polystyrene standards by universal calibration, at a flow rate of about 1 ml/min. The polymer polydispersity (Mw/Mn) is preferably less than 2.0, more preferably less than or equal to 1.8, more preferably less than or equal to 1.6, and more preferably less than or equal to 1.5.

A photoresist composition includes the copolymer having the polymer-bound PAG as described above. The photoresist may also include, in addition to the PAG compound and polymer, additives including for example a photo-destroyable base, and a surfactant. Other additives, such as dissolution rate inhibitors, sensitizers, additional PAGs, etc. may also be included. The photoresist components are dissolved in solvent for dispense and coating.

The photoresist may include a photo-destroyable base. Inclusion of base materials, preferably the carboxylate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing PAGs, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Photo-destroyable bases include cation/anion pairs of the following structures, and the cation is triphenylsulfonium or one of the following:

where R is independently H, a $C_{1-20}$ alkyl, a $C_{6-20}$ aryl, or a $C_{6-20}$ alkyl aryl, and the anion is where R is independently H, a $C_{1-20}$ alkyl, a $C_{1-20}$ alkoxy, a $C_{6-20}$ aryl, or a $C_{6-20}$ alkyl aryl. Other photo-destroyable bases include those based on non-ionic photo-decomposing chromophores such as, for example, 2-nitrobenzyl groups and benzoin groups. An exemplary photobase generator is ortho-nitrobenzyl carbamate.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBM), or ionic quenchers including quaternary alkyl ammonium salts such as tetrabutylammonium hydroxide (TBAH) or tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

The photoresist composition disclosed herein may include the copolymer in an amount of 50 to 99 wt %, specifically 55 to 95 wt %, more specifically 60 to 90 wt %, and still more specifically 65 to 90 based on the total weight of solids. It will be understood that "copolymer" used in this context of a component in a photoresist may mean only the copolymer disclosed herein, or a combination of the copolymer with another polymer useful in a photoresist. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photo-destroyable base, quencher, surfactant, any added PAG, and any optional additives, exclusive of solvent.

The photoresist including the copolymer having the anion-bound PAG as disclosed herein may be used to provide a layer comprising the photoresist. A coated substrate may be formed from the photoresist containing the polymer-bound PAG. Such a coated substrate includes: (a) a substrate having one or more layers to be patterned on a surface thereof; and (b) a layer of the photoresist composition including the polymer-bound PAG over the one or more layers to be patterned.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including the polymer-bound PAG on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

The photoresist may, when used in one or more such a pattern-forming processes, be used to fabricate electronic and optoelectronic devices such as memory devices, processor chips (CPU's), graphics chips, and other such devices.

The invention is further illustrated by the following examples. All compounds and reagents used below are available commercially except where a procedure is provided. Triphenylsulfonium 1,1-difluoro-2-(methacryloyloxy)ethane-1-sulfonate (the TPS F2 PAG monomer) was obtained commercially from Central Glass.

Structural characterization was carried out by nuclear magnetic resonance (NMR) spectrometry on an INOVA 500 NMR Spectrometer with OMNI-PROBE (operating at 500 MHz for proton) or GEMINI 300 NMR Spectrometer (operating at 282 MHz for fluorine), each from Varian. Polymer composition was determined by quantitative $^{13}$C NMR at 125 MHz using NOE suppression techniques (i.e., Cr(acetylacetonate)$_3$ and a pulse delay of 2 seconds). Molecular weight (Mw) and polydispersity (PD) were determined by gel permeation chromatography (GPC) using a sample concentration of 1 mg/ml and a crosslinked styrene-divinylbenzene column with universal calibration curve calibrated with polystyrene standards, and eluted with tetrahydrofuran containing 0.2 wt % lithium nitrate at a flow rate of 1 ml/min.

Synthesis of phenyl dibenzothiophenium 1,1-difluoro-2-(methacryloyloxy)ethane-1-sulfonate (PDBT F2 PAG monomer from Polymer Example 2). Triethylammonium 1,1-difluoro-2-(methacryloyloxy)ethane-1-sulfonate (4.00 g, 12.1 mmol) and phenyl dibenzothiophenium bromide (4.50 g, 31.2 mmol) were added to a 100 mL round bottom flask, along with 30 mL of dichloromethane and 30 mL of distilled, de-ionized water. The mixture was stirred vigorously overnight. Stirring was stopped and the mixture separated into two clear layers; the organic layer was washed 2×30 mL 1% aqueous hydrochloric acid and 5×30 mL of distilled, de-ionized water. Hydroquinone (1 mg) was added and dichloromethane was removed by rotary evaporation to yield the product as a solid (3.9 g, 80% yield). $^1$H NMR (500 MHz, CDCl$_3$) δ 8.2 (m, 4H), 7.8 (t, 2H), 7.7 (d, 2H), 7.6 (m, 3H), 7.5 (t, 2H), 6.2 (s, 1H), 5.6 (s, 1H), 4.9 (m, 2H), 1.9 (s, 3H). $^{19}$F NMR (300 MHz, acetone-d$_6$) δ −115.8 (s, 2F).

An exemplary polymer (Polymer 1) was prepared according to the reaction shown in Scheme 1, and described in the procedure below.

Scheme 1.

Polymer 1 was prepared by the following procedure. The four monomers shown in Scheme 1, above were weighed into a 20 mL vial (2-(2-phenyl)propyl methacrylate, PPMA: 1.70 g, 8.32 mmol; 3,5-di-(1,1,1,3,3,3-hexafluoro-2-hydroxypropan-2-yl)cyclohexyl methacrylate, di-HFA: 1.60 g, 3.20 mmol; alpha-(gamma-butyrolactone) methacrylate, a-GBLMA: 2.07 g, 12.2 mmol; TPS-F2 PAG monomer:

0.943 g, 1.91 mmol). A 70:30 w/w mixture of ethyl lactate and cyclohexanone 9.47 g (sufficient to give a 40% solids solution on combination with the monomers) was weighed into a separate vial. Half of this solvent was added to the monomers to dissolve them fully and the other half was retained. The dithioester RAFT chain transfer agent shown in Scheme 1 (2-(2-cyanopropyl)benzenedithionate, 0.166 g, 0.749 mmol) was weighed into a third 20 mL vial, and the monomer solution was filtered through a plug of neutral alumina (approximately 2 cm) to remove inhibitor and other impurities. The filtered solution was then added directly to the vial with the RAFT agent, followed by passing the remaining solvent through the alumina column and into the vial. A solution of azobis-isobutyronitrile (AIBN) (0.749 mL, 0.150 mmol, 0.2 M solution in toluene) was then added to the monomer/chain transfer agent solution, and the vial was capped and heated to 60° C. for 40 h. At this time, the reaction was cooled to room temperature and the contents precipitated into 100 mL of a 95:5 mixture of diisopropyl ether:methanol (v/v). The solid polymer was isolated by filtration and the redissolved in tetrahydrofuran (9 mL) and reprecipitated into another 100 mL of the diisopropyl ether: methanol mixed solvent. The precipitate was air-dried for 48 h. and dried in vacuo at 40° C. overnight to yield 4.46 g (71%) of a flakey pink polymer.

Polymer 1 was characterized by $^{13}$C NMR and GPC. Relative monomer ratios from $^{13}$C NMR integrations: PPMA: 32%, a-GBLMA: 48%, di-HFA: 10%, TPS F2 PAG: 10% (mole %). GPC: Mw=5,900; Mn=3,900; Mw/Mn=1.52.

Another exemplary polymer (Polymer 2) was prepared according to the reaction shown in Scheme 2, and described in the procedure below.

VAZO V-601 initiator (0.180 g, 0.782 mmol) was added and the vial was capped and heated to 60° C. for 24 h, and the vial was cooled to RT and the contents were precipitated into 230 mL of 95:5 v/v mixture of isopropyl ether:methanol. The solid polymer was collected by filtration, redissolved in tetrahydrofuran (THF, 23 mL) and reprecipitated into another 230 mL of isopropyl ether-methanol solvent. The resulting pink polymer was dried in a vacuum oven at 45° C. overnight, yielding 13.5 g (82%).

Relative monomer ratios from $^{13}$C NMR (100 MHz, acetone-$d_6$) integrations: PPMA: 35%, a-GBLMA: 48%, di-HFA: 11%, PDBT F2 PAG: 6% (mole %). GPC: Mw=6, 300 g/mol; Mn=5,400 g/mol; Mw/Mn=1.17.

Comparative Polymers 1 was prepared using the same monomer set and method as that used in Polymer 1, but without inclusion of the chain transfer agent.

Comparative Polymer 1 was prepared by the following procedure.: 2-Phenyl-2-propyl methacrylate (PPMA, 0.74 g, 3.62 mmol), alpha-(gamma-butyrolactone) methacrylate (a-GBLMA, 0.63 g, 3.70 mmol), 3,5-bis(1,1,1,3,3,3-hexafluoro-2-hydroxypropan-2-yl)cyclohexyl methacrylate (di-HFA, 1.50 g, 3.00 mmol), and triphenylsulfonium 1,1-difluoro-2-(methacryloyloxy)ethane-1-sulfonate (TPS F2 PAG monomer, 0.59 g, 1.20 mmol) were dissolved in 27.4 g of ethyl lactate/cyclohexanone solvent (70:30 v/v). This solution was added to the reaction vessel and heated to 75° C. 2-Phenyl-2-propyl methacrylate (PPMA, 9.27 g, 45.4 mmol), alpha-(gamma-butyrolactone) methacrylate (a-GBLMA, 11.76 g, 69.1 mmol), 3,5-bis(1,1,1,3,3,3-hexafluoro-2-hydroxypropan-2-yl)cyclohexyl methacrylate (di-HFA, 10.85 g, 21.6 mmol), and triphenylsulfonium-1,1-difluoro-2-(methacryloyloxy)ethane-1-sulfonate (TPS F2 PAG monomer, 3.20 g, 6.50 mmol) were dissolved in 35.4

Scheme 2

In a drybox, 2-phenyl-2-propyl methacrylate (PPMA, 5.00 g, 24.5 mmol), alpha-(gammabutyrolactone) methacrylate (a-GBLMA, 5.29 g, 31.1 mmol), 3,5-bis(1,1,1,3,3,3-hexafluoro-2-hydroxypropan-2-yl)cyclohexyl methacrylate (di-HFA, 3.64 g, 7.27 mmol), and phenyl dibenzothiophenium 1,1-difluoro-2-(methacryloyloxy)ethane-1-sulfonate (PDBT F2 PAG monomer, 1.62 g, 3.31 mmol) were weighed into a 40 mL vial. Into another vial was weighed 23.3 g of a 70:30 mixture of gamma-butyrolactone:ethyl lactate. Half of this solvent was added to the monomers to dissolve them fully and the other half was retained. The RAFT agent 2-cyano-2-propyl benzenedithioate (0.867 g, 3.92 mmol) was weighed into a 40 mL vial and the monomer solution filtered through a plug of neutral alumina directly into the vial with the RAFT agent, followed by passing the remaining solvent through the alumina column and into the vial.

g of ethyl lactate/cyclohexanone solvent (70:30 v/v). 2,2-Azobis(2,4-dimethylvaleronitrile) (3.80 g, 15.3 mmol) was dissolved in 3.8 g of acetonitrile/tetrahydrofuran solvent (2:1 v/v). The monomer and initiator solutions were fed separately into the reaction vessel over 4 hours to maintain 75° C., and heating was continued for an additional 2 hours. The reaction solution was then cooled to room temperature and precipitated into 889 g of agitated isopropyl ether: methanol (95:5 w/w). The resultant polymer was collected by vacuum filtration and dried in vacuo at 45° C. for 24 h. The crude dried polymer was dissolved to 30 wt % solids in tetrahydrofuran (THF) and reprecipitated into a further 1,070 g of the mixed isopropyl ether:methanol solvent. The reprecipitated polymer was again collected by vacuum filtration and dried in vacuo oven at 45° C. for 24 h. to yield 19.5 g (51%) of the polymer as a white powder.

Comparative Polymer 1 was characterized by $^{13}$C NMR and GPC. Relative monomer ratios from $^{13}$C NMR integrations: PPMA: 32%, a-GBLMA: 48%, di-HFA: 9%, TPSF2 PAG: 12%. GPC: Mw=5,661; Mn=3,606; Mw/Mn=1.57.

Comparative Polymer 2 was prepared using the same monomers as in Polymer Example 1, but without inclusion of the chain transfer agent.

Polymer of Comparative Example 2 was prepared by the following procedure: 2-phenyl-2-propyl methacrylate (PPMA, 1.94 g, 9.50 mmol), alpha-(gammabutyrolactone) methacrylate (a-GBLMA, 1.62 g, 9.52 mmol), 3,5-bis(1,1,1,3,3,3-hexafluoro-2-hydroxypropan-2-yl)cyclohexyl methacrylate (di-HFA, 2.83 g, 5.66 mmol), and triphenylsulfonium-1,1-difluoro-2-(methacryloyloxy)ethane-1-sulfonate (TPS F2 PAG monomer, 1.54 g, 3.13 mmol) were dissolved in 66.6 g of ethyl lactate/cyclohexanone solvent (70:30 v/v). This solution was added to a reaction vessel and heated to 75° C. 2-Phenyl-2-propyl methacrylate (PPMA, 30.06 g, 0.147 mol), alpha-(gamma-butyrolactone) methacrylate (a-GBLMA, 33.07 g, 0.194 mol), 3,5-bis(1,1,1,3,3,3-hexafluoro-2-hydroxypropan-2-yl)cyclohexyl methacrylate (di-HFA, 20.79 g, 0.0416 mol), triphenylsulfonium-1,1-difluoro-2-(methacryloyloxy)ethane-1-sulfonate (TPS F2 PAG monomer, 8.99 g, 0.0183 mol) and 2,2-azobis(2,4-dimethylvaleronitrile) (10.66 g, 0.0612 mol) were dissolved in 88.0 g of ethyl lactate/cyclohexanone solvent (70:30 v/v). The monomer/initiator solution was fed into the vessel over 4 hours to maintain 75° C., and heating was continued for an additional 2 hours. The reaction solution was cooled to room temperature and precipitated into 2,850 g of isopropyl ether:methanol (95:5 w/w). The resultant polymer was collected by vacuum filtration and dried in a vacuum oven at 45° C. for 24 h. The crude dried polymer was dissolved to 30 wt % solids in tetrahydrofuran (THF) and reprecipitated into the mixed solvent isopropyl ether:methanol. The resultant re-precipitated polymer was collected by vacuum filtration and dried in vacuo at 45° C. for 24 h. to yield 91 g (62%) of the polymer as a white powder.

Comparative Polymer 2 was characterized by $^{13}$C NMR and GPC. Relative monomer ratios from $^{13}$C NMR integrations: PPMA: 30%, a-GBLMA: 44%, di-HFA: 13%, TPSF2 PAG: 13%. GPC: Mw=5,347; Mn=3,495; Mw/Mn=1.53.

Comparative Polymer 3 was prepared using the same monomers as in Polymer 2, but without inclusion of the chain transfer agent.

Polymer of Comparative Example 3 was prepared by the following procedure: 2-phenyl-2-propyl methacrylate (PPMA, 1.94 g, 9.50 mmol), alpha-(gammabutyrolactone) methacrylate (a-GBLMA, 1.62 g, 9.52 mmol), 3,5-bis(1,1,1,3,3,3-hexafluoro-2-hydroxypropan-2-yl)cyclohexyl methacrylate (di-HFA, 2.83 g, 5.66 mmol), and phenyl dibenzothiophenium-1,1-difluoro-2-(methacryloyloxy)ethane-1-sulfonate (PDBT F2 PAG monomer, 1.54 g, 3.14 mmol) were dissolved in 66.6 g of gamma-butyrolactone: ethyl lactate solvent (70:30 v/v). This solution was added to the reaction vessel and heated to 75° C. 2-Phenyl-2-propyl methacrylate (PPMA, 30.06 g, 0.147 mol), alpha-(gamma-butyrolactone) methacrylate (a-GBLMA, 33.07 g, 0.194 mol), 3,5-bis(1,1,1,3,3,3-hexafluoro-2-hydroxypropan-2-yl)cyclohexyl methacrylate (di-HFA, 20.79 g, 0.0416 mol), and phenyl dibenzothiophenium-1,1-difluoro-2-(methacryloyloxy)ethane-1-sulfonate (8.99 g, 0.0183 mol) were dissolved in 88.0 g of gamma-butyrolactone:ethyl lactate solvent (70:30 v/v). 2,2-Azobis(2,4-dimethylvaleronitrile) (10.66 g, 0.0612 mol) was dissolved in 10.7 g of acetonitrile:tetrahydrofuran solvent (2:1 v/v). The monomer and initiator solutions were fed separately into the reaction vessel over 4 hours to maintain 75° C., and heating was continued for an additional 2 hours. The reaction solution was cooled to room temperature and precipitated into 2,850 g of isopropyl ether:methanol (95:5 w/w). The resultant polymer was collected by vacuum filtration and dried in vacuo at 45° C. for 48 h. The crude dried polymer was dissolved to 30 wt % solids in tetrahydrofuran (THF) and reprecipitated into the mixed isopropyl ether:methanol (95:5 w/w). The reprecipitated polymer was collected by vacuum filtration and dried in vacuo at 45° C. for 48 h. to yield 90 g (89%) of the polymer as a white powder.

Comparative Polymer 3 was characterized by $^{13}$C NMR and GPC. Relative monomer ratios from $^{13}$C NMR integrations: PPMA: 36%, a-GBLMA: 47%, di-HFA: 12%, PAG: 5%. GPC: Mw=5,600; Mn=3,544; Mw/Mn=1.58.

Photoresist preparation and processing. Formulation Examples 1 and 2 (CEx. 1 and 2) and Comparative Formulation Examples 1-3 (CFEx. 1-3) were prepared per the compositions shown in Table 1, below, to obtain lithographic data at 248 nm (DUV) and 13.4 nm (EUV) wavelengths.

General formulation procedure. Positive-tone photoresist compositions were prepared by combining polymer, tetrahydroxyisopropylethylene diamine quencher solution dissolved at either 0.5 or 1 weight % in ethyl lactate (EL), Omnova PF656 surfactant (available from Omnova) dissolved at 0.5 weight % in ethyl lactate, and additional EL and methyl 2-hydroxybutyrate (HBM) solvent in the amounts indicated in Table 1. The formulated solutions were passed through a 0.2 μm PTFE filter.

TABLE 1

| Formulation Example | Polymer | Polymer Amount (g) | Quencher soln. in EL (1 wt %) | Quencher soln. in EL (0.5 wt %) | Omnova PF 656 (0.5 wt % in EL) | EL (g) | HBM (g) |
|---|---|---|---|---|---|---|---|
| FEx 1 | Polymer 1 | 0.627 g | 0.251 g | x | 0.125 g | 20.186 g | 8.811 g |
| CEx 1 | Comp. Polymer 1 | 0.995 g | 0.398 g | x | 0.199 g | 26.708 g | 11.700 g |
| CEx 2 | Comp. Polymer 2 | 0.622 g | 0.249 g | x | 0.124 g | 16.692 g | 7.313 g |
| FEx 2 | Polymer 2 | 0.795 g | x | 0.477 g | 0.159 g | 19.803 g | 8.761 g |
| CEx 3 | Comp. Polymer 3 | 0.531 g | x | 0.159 g | 0.106 g | 13.364 g | 5.840 g |

The above photoresist formulations were lithographically processed as follows. The photoresist was spun coated using a TEL ACT-8 (Tokyo Electron) coating track or similar equipment onto a 200 mm silicon wafer having an organic antireflective coating (AR™9, Dow Electronic Materials LLC for 248 nm exposure, or an organic underlayer for EUV) and baked at 130° C. for 90 seconds to form a resist film of about 50-60 nm in thickness. The resulting photoresist layer was exposed through an open-frame mask to KrF excimer laser radiation (248 nm) or EUV radiation (eMET, 13.4 nm) and additionally through a patterned mask to image 28 nm 1:1 line/space features (EUV radiation). The exposed wafers were post exposure baked at 100° C. for 60 seconds and developed with 0.26 N aqueous tetramethylammonium hydroxide developer solution to form either a contrast pattern or a positive-tone photoresist pattern. Linewidth and linewidth roughness (LWR) were determined by top-down scanning electron microscopy (SEM) using a Hitachi 9380 CD-SEM, operating at an accelerating voltage of 800 volts (V), probe current of 8.0 picoamperes (pA), using 200 Kx magnification at 1.0 digital zoom, with the number of frames set to 64. LWR was measured over a 2 μm line length in steps of 40 nm, and reported as the average for the measured region. Unexposed film thickness loss was obtained by measuring the thickness loss of a photoresist film coated on a substrate before and after 60 s contact with 0.26N aqueous tetramethylammonium hydroxide developer solution.

Evaluation at 248 nm (DUV). Photospeed was obtained at 248 nm exposure; dose to clear ($E_0$) values (in millijoules per square centimeter, mJ/cm$^2$) are shown in Table 2. Unexposed film thickness loss (UFTL) after developing was also obtained; UFTL values (nm) are shown in Table 2.

Evaluation at 13.4 nm (EUV). Photospeed (dose-to-clear, $E_0$; dose-to-size for measured linewidth, $E_s$), measured linewidth (nm) and LWR data was obtained for lines/space features (1:1 pitch) targeting 28 nm feature size (CD), as shown in Table 2, below.

(4.6 nm) for EUV exposure relative to that of the comparative CFEx. 2 (5.8 nm). Also, the formulation (FEx. 2) made with narrow polydispersity Polymer 2 has significantly reduced LWR (3.2 nm) for EUV relative to comparative CFEx. 3 (4.3 nm).

Figure 2:
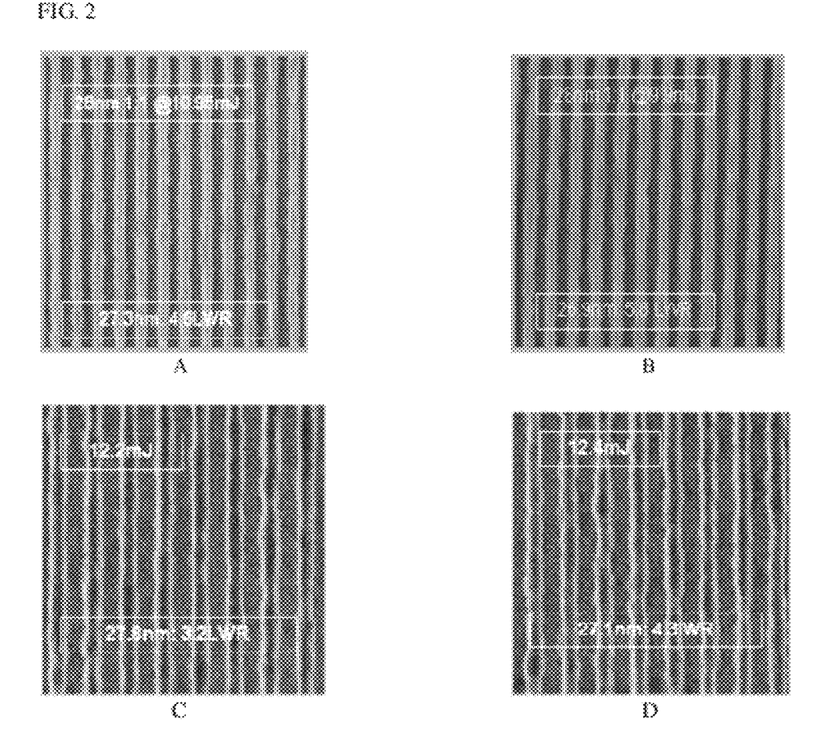
FIG. 2 shows top-down scanning electron microscope (SEM) images A-D for 1:1 lines/spaces imaged at 28 nm nominal feature size at EUV exposure wavelengths for two different exemplary photoresists (images A and C) prepared using polymers prepared by RAFT polymerization, and comparative photoresists (B and D) prepared using polymers that are compositionally similar to those used in A and C (respectively), and which were prepared by a conventional radical polymerization method.

FIG. 2 shows top-down SEM micrographs A-D for 1:1 lines/spaces imaged at 28 nm nominal feature size at EUV exposure wavelengths using the above formulated photoresists and comparative photoresists (where A is FEx. 1; B is CFEx. 2, C is FEx. 2; and D is CFEx. 3). Comparing FIGS. 2A and 2B shows cleaner lines obtained in FIG. 2A (FEx. 1) as determined by the measured LWR of 4.6 nm, relative to the LWR of 5.8 nm obtained for FIG. 2B (CFEx. 2). Likewise, comparing FIGS. 2C and 2D shows cleaner lines obtained in FIG. 2C (FEx. 2) as determined by the measured LWR of 3.2 nm, relative to 4.3 nm obtained for FIG. 2D (CFEx. 3).

Thus, formulations made with narrow polydispersity Polymers 1 and 2 (FEx. 1 and 2, respectively), prepared by RAFT polymerization, have reduced UFTL and LWR under EUV exposure when compared with formulations made with Comparative Polymer 2 (CFEx. 2) and Comparative Polymer 3 (CFEx. 3), each prepared using standard radically-initiated polymerization methods and which do not include a RAFT chain transfer agent.

TABLE 2

| Formulation Example | Polymer | PAG | $E_0$, DUV (mJ/cm$^2$) | UFTL (nm) | $E_0$, EUV (mJ/cm$^2$) | Measured linewidth (nm) | $E_s$, EUV (mJ/cm$^2$) | LWR (nm) |
|---|---|---|---|---|---|---|---|---|
| FEx 1 | Polymer 1 | TPS-F2 | 5.6 | 1.8 | 5.2 | 27.3 | 10.95 | 4.6 |
| CFEx. 1 | Comparative Polymer 1 | TPS-F2 | 7.1 | 2.2 | x | x | x | x |
| CFEx. 2 | Comparative Polymer 2 | TPS-F2 | 5.4 | 3.0 | 5.4 | 26.9 | 9.9 | 5.8 |
| FEx 2 | Polymer 2 | PDBT-F2 | 28.5 | 0.3 | 4.2 | 27.8 | 12.2 | 3.2 |
| CFEx 3 | Comparative Polymer 3 | PDBT-F2 | 27.5 | 2.2 | 4.4 | 27.1 | 12.4 | 4.3 |

In Table 2, it can be seen that the formulation (FEx. 1) made with narrow polydispersity Polymer 1 prepared by RAFT polymerization, has lower (faster) photospeed $E_0$ at 248 nm exposure compared to the comparative CFEx. 1 (made with Comparative Polymer 1), and comparable DUV $E_0$ and EUV $E_0$ and $E_s$ to that of the comparative CFEx. 2 (made with Comparative Polymer 2). Similarly, the formulation (FEx. 2) made with narrow polydispersity Polymer 2, has comparable DUV and EUV $E_0$ and $E_s$ to that of CFEx. 2 (made with Comparative Polymer 2). For unexposed film thickness loss determined at 248 nm, FEx. 1 has less UFTL (1.8 nm) than CFEx. 2 (3.0 nm), and FEx. 2 has less UFTL (0.3 nm) than CFEx. 2 (2.2 nm).

Figure 1:
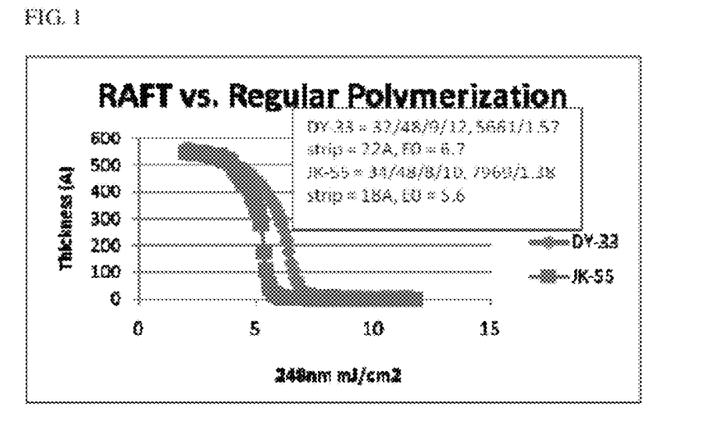
FIG. 1 shows a contrast curve of thickness (in Angstroms) versus exposure dose ($E_o$, in millijoules per square centimeter) at 248 nm exposure for an exemplary photoresist prepared using a polymer prepared by RAFT polymerization, and for a comparative photoresist prepared using a compositionally similar polymer prepared by a conventional radical polymerization method.

FIG. 1 shows the comparative contrast curves obtained at 248 nm (DUV) for CFEx. 1 (identified as "DY-33" in FIG. 1), and FEx. 1 (identified as "JK-55" in FIG. 1). At the DUV wavelength, FEx. 1, formulated using Polymer 1, has a faster photospeed ($E_0$) and sharper contrast (film thickness loss over time) when compared with CFEx. 1, formulated with Comparative Polymer 1 (prepared by non-RAFT polymerization. It is therefore seen that the photoresist prepared using the RAFT polymer (Polymer 1) exhibits improved contrast relative to that of the non-RAFT polymer (Comparative Polymer 1).

In addition, formulation (FEx. 1) made with narrow polydispersity Polymer 1 has a significantly reduced LWR All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A polymer, comprising the reversible addition-fragmentation chain-transfer polymerized product of monomers comprising:

an acid-deprotectable monomer having the formula (I), a base-soluble monomer having the formula (II), a lac- tone-containing monomer of the formula (III), and a photoacid-generating monomer of the formula (IV):

(I)

(II)

(III)

(IV)

wherein each $R^a$ is independently H, F, $C_{1-10}$ alkyl, or $C_{1-10}$ fluoroalkyl,
$R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure,
$Q_1$ is an ester-containing or non-ester containing $C_{1-20}$ alkyl, $C_{3-20}$ cycloalkyl, $C_{6-20}$ aryl, or $C_{7-20}$ aralkyl,
W is a base-reactive group comprising —C(=O)—OH; —C(CF$_3$)$_2$OH; —NH—SO$_2$—Y$^1$ where Y$^1$ is F or $C_{1-4}$ perfluoroalkyl; an aromatic —OH; or an adduct of any of the foregoing with a vinyl ether,
a is an integer of 1 to 3,
L is a monocyclic, polycyclic, or fused polycyclic $C_{4-20}$ lactone-containing group,
$Q_2$ is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group,
A is ester-containing or non ester-containing and fluorinated or non-fluorinated, and is $C_{1-20}$ alkyl, $C_{3-20}$ cycloalkyl, $C_{6-20}$ aryl, or $C_{7-20}$ aralkyl,
wherein when $Q_2$ is ester-containing, (i) the ester forms a connective link between $Q_2$ and the point of attachment to the double bond of the formula (IV), and (ii) A is non-ester-containing,
Z is an anionic moiety comprising sulfonate, an anion of a sulfonamide, or an anion of a sulfonimide,
G has formula (V):

(V)

wherein X is S or I,
each $R^c$ is halogenated or non-halogenated and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ groups is optionally attached to one adjacent $R^c$ group by a single bond, and
z is 2 or 3, provided that when X is I, z is 2, or when X is S, z is 3;
a chain transfer agent of formula (IX);

(IX)

wherein in formula (IX):
Z is a y valent $C_{1-20}$ organic group, wherein y is an integer of from 1 to 3, x is 0 or 1,
$R^d$ is a substituted or unsubstituted $C_{1-20}$ alkyl, $C_{3-20}$ cycloalkyl, $C_{6-20}$ aryl, or $C_{7-20}$ aralkyl; and
optionally, an initiator.

2. The polymer of claim 1, wherein the acid deprotectable monomer of formula (I) comprises:

or a combination comprising at least one of the foregoing, wherein $R^a$ is H, F, $C_{1-6}$ alkyl, or $C_{1-6}$ fluoroalkyl.

3. The polymer of claim 1, wherein the base-soluble monomer having the formula (II) comprises:

or a combination comprising at least one of the foregoing, and wherein the lactone-containing monomer of the formula (III) comprises:

or a combination comprising at least one of the foregoing, wherein $R^a$ is H, F, $C_{1-6}$ alkyl, or $C_{1-6}$ fluoroalkyl.

4. The polymer of claim 1, wherein A is a $-[(C(R^e)_2)_{x1}C(=O)O]_c-(C(R^f)_2)_{y1}(CF_2)_{z1}-$ group, or an o-, m- or p-substituted $-C_6R^g_4-$ group, where each $R^e$, $R^f$, and $R^g$ are each independently H, F, $C_{1-6}$ fluoroalkyl, or $C_{1-6}$ alkyl, c is 0 or 1, x1 is an integer of 1 to 10, y1 and z1 are independently integers of from 0 to 10, and the sum of y1+z1 is at least 1.

5. The polymer of claim 1, wherein the photoacid-generating monomer of formula (IV) is:

or a combination comprising at least one of the foregoing, where each $R^a$ is independently H, F, $C_{1-6}$ alkyl, or $C_{1-6}$ fluoroalkyl, k is an integer of 0 to 4, l is an integer of 0 to 3, and G is a cation of formula (V).

6. The polymer of claim 1, wherein G has the formula (VI), (VII), or (VIII):

wherein X is I or S, $R^h$, $R^i$, $R^j$, and $R^k$ are each independently hydroxy, nitrile, halogen, $C_{1-10}$ alkyl, $C_{1-10}$ fluoroalkyl, $C_{1-10}$ alkoxy, $C_{1-10}$ fluoroalkoxy, $C_{6-20}$ aryl, $C_{6-20}$ fluoroaryl, $C_{6-20}$ aryloxy, or $C_{6-20}$ fluoroaryloxy, $Ar^1$ and $Ar^2$ are independently $C_{10-30}$ fused or singly bonded polycyclic aryl groups; $R^l$ is a lone pair of electrons where X is I, or a $C_{6-20}$ aryl group where X is S; p is an integer of 2 or 3, wherein when X is I, p is 2, and where X is S, p is 3, q and r are each independently an integer from 0 to 5, and s and t are each independently an integer from 0 to 4.

7. The polymer of claim 1, wherein the photoacid-generating monomer of formula (IV) has the formula:

-continued wherein $R^a$ is H, F, $C_{1-6}$ alkyl, or $C_{1-6}$ fluoroalkyl.

8. The polymer of claim 1, wherein the chain transfer agent of formula (IX) has the structure of formula (X):

(X)

wherein $R^m$ is a $C_{1-10}$ alkyl, $C_{1-10}$ alkoxy, $C_{3-10}$ cycloalkyl, $C_{6-10}$ aryl, or $C_{7-10}$ aralkyl group, and $R^c$ is substituted or unsubstituted and is a $C_{1-10}$ alkyl or $C_{6-10}$ aryl group.

9. A photoresist composition comprising the polymer of claim 1.

10. A coated substrate, comprising: (a) a substrate having one or more layers to be patterned on a surface thereof; and (b) a layer of a photoresist composition of claim 9 over the one or more layers to be patterned.

11. A method of forming a reversible addition-fragmentation chain-transfer polymerized product, comprising radically or thermally initiating the monomers of claim 1 in the presence of the chain transfer agent.

12. A method of forming an electronic device, comprising:

(a) applying a layer of the photoresist composition of claim 9 on a surface of a substrate;
(b) patternwise exposing the photoresist composition layer to activating radiation; and
(c) developing the exposed photoresist composition layer to provide a resist relief image.

\* \* \* \* \*